(12) United States Patent
Kim et al.

(10) Patent No.: US 9,965,117 B2
(45) Date of Patent: May 8, 2018

(54) DISPLAY APPARATUS

(71) Applicant: Samsung Display Co., Ltd., Yongin, Gyeonggi-do (KR)

(72) Inventors: Hun Kim, Yongin (TW); Hyojeong Kwon, Yongin (KR); Wonkyu Choe, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 209 days.

(21) Appl. No.: 14/800,974

(22) Filed: Jul. 16, 2015

(65) Prior Publication Data

US 2016/0259446 A1 Sep. 8, 2016

(30) Foreign Application Priority Data

Mar. 2, 2015 (KR) ........................ 10-2015-0029103

(51) Int. Cl.
*G06F 3/044* (2006.01)
*H01L 51/52* (2006.01)
*H01L 27/32* (2006.01)

(52) U.S. Cl.
CPC ............ *G06F 3/044* (2013.01); *H01L 51/529* (2013.01); *H01L 51/5246* (2013.01); *G06F 2203/04103* (2013.01); *G06F 2203/04106* (2013.01); *H01L 27/323* (2013.01)

(58) Field of Classification Search
None
See application file for complete search history.

(56) References Cited

U.S. PATENT DOCUMENTS

| 6,160,224 A * | 12/2000 | Ogashiwa ............ B23K 35/262 148/400 |
| 2003/0234608 A1 | 12/2003 | Lee et al. |
| 2008/0174978 A1* | 7/2008 | Inoue ................... H01L 21/4857 361/784 |
| 2011/0134056 A1 | 6/2011 | Kim et al. |
| 2011/0232738 A1 | 9/2011 | Yang et al. |

(Continued)

FOREIGN PATENT DOCUMENTS

| KR | 10-2004-0000630 | 1/2004 |
| KR | 10-2011-0062469 | 6/2011 |

(Continued)

*Primary Examiner* — Amare Mengistu
*Assistant Examiner* — Shawna Stepp Jones
(74) *Attorney, Agent, or Firm* — Knobbe Martens Olson & Bear LLP

(57) ABSTRACT

A display apparatus includes a first substrate on which a display area is defined; a second substrate facing the first substrate and including a touch screen layer on a surface thereof; and a sealing portion between the first substrate and the second substrate, and bonding the first substrate and the second substrate to each other. The sealing portion is formed around the display area, and the touch screen layer includes a plurality of sensing patterns and a plurality of bonding pad portions electrically connected to the plurality of sensing patterns. Each of the bonding pad portions includes a pad electrode electrically connected to the plurality of sensing patterns and a cover portion surrounding a part of the pad electrode, and the cover portion is opaque and is formed to overlap the sealing portion.

18 Claims, 6 Drawing Sheets

(56) References Cited

U.S. PATENT DOCUMENTS

2014/0042398 A1*  2/2014  Choi .................. H01L 27/3244
                                                        257/40
2014/0198267 A1   7/2014  Jeong et al.
2015/0305160 A1*  10/2015 Funahashi ............... H01L 23/13
                                                        348/374

FOREIGN PATENT DOCUMENTS

| KR | 10-2011-0106681 | 9/2011 |
| KR | 10-2012-0076065 | 7/2012 |
| KR | 10-2014-0093092 | 7/2014 |

* cited by examiner

DISPLAY APPARATUS

RELATED APPLICATION

This application claims the benefit of Korean Patent Application No. 10-2015-0029103, filed on Mar. 2, 2015, in the Korean Intellectual Property Office, the disclosure of which is incorporated herein in its entirety by reference.

BACKGROUND

Field

One or more embodiments relate to a display apparatus.

Description of the Related Technology

Recently, conventional display apparatuses have been replaced with flat type display apparatuses that are thin and portable. Also, research into a technology of applying a touch panel function to the flat type display has been conducted. When a touch panel function is applied to a display apparatus, the flat type display apparatus may operate not only as a display device but also as an input device that can be operated by a user by touching a panel thereof via a pen or finger.

SUMMARY OF CERTAIN INVENTIVE ASPECTS

One or more embodiments include a display apparatus having an improved response speed when a touch screen is touched.

Additional aspects will be set forth in part in the description which follows and, in part, will be apparent from the description, or may be learned by practice of the presented embodiments.

According to one or more embodiments, a display apparatus includes: a first substrate on which a display area is defined; a second substrate facing the first substrate and including a touch screen layer on a surface thereof; and a sealing portion between the first substrate and the second substrate and bonding the first substrate and the second substrate to each other, the sealing portion formed around the display area, wherein the touch screen layer may include a plurality of sensing patterns and a plurality of bonding pad portions electrically connected to the plurality of sensing patterns, wherein each of the bonding pad portions may include a pad electrode electrically connected to the plurality of sensing patterns and a cover portion surrounding a part of the pad electrode, and wherein the cover portion may be opaque and may overlap the sealing portion.

The cover portion may convert absorbed light into heat.

The cover portion may perform a black-body radiation.

The pad electrode may have a resistance that is less than a resistance of the cover portion.

The cover portion may include at least of manganese, chrome, nickel, or cobalt.

The cover portion may include a first part disposed on a lower surface of the pad electrode, a second part disposed on an upper surface of the pad electrode, and a pair of side portions that connect the first part and the second part to each other, wherein the second part may have a thickness between about 500 Å to about 1000 Å.

The second part may have an irregular surface structure.

The second substrate may have a plurality of via holes, and a conductive member that contacts the first part and the sealing portion is filled in each of the plurality of via holes.

A length of the cover portion along with a length direction of the pad electrode may be about 110% to about 120% of a width of the sealing portion.

A width of the cover portion in a direction perpendicular to a length direction of the pad electrode may be about 110% to about 120% of a width of the pad electrode.

The touch screen layer may further include connectors for connecting the plurality of sensing patterns and the bonding pad portions to each other.

The plurality of sensing patterns may include a plurality of first sensing patterns and a plurality of second patterns that are electrically insulated from the plurality of first sensing patterns.

The plurality of first sensing patterns may be arranged in a first direction and the plurality of second sensing patterns are arranged in a second direction crossing the first direction, and the connectors may include a first connector connecting the first sensing patterns that are adjacent to each other and a second connector connecting the second sensing patterns that are adjacent to each other.

The display apparatus may further include a display unit having the display area on the first substrate, wherein the display unit may include an organic light emitting diode, and the organic light emitting diode comprises a first electrode, a second electrode, and an intermediate layer disposed between the first electrode and the second electrode and including an organic emission layer.

The display apparatus may further include a thin film transistor electrically connected to the first electrode and including an active layer, a gate electrode, a source electrode, and a drain electrode.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION OF CERTAIN INVENTIVE EMBODIMENTS

Figure 1:
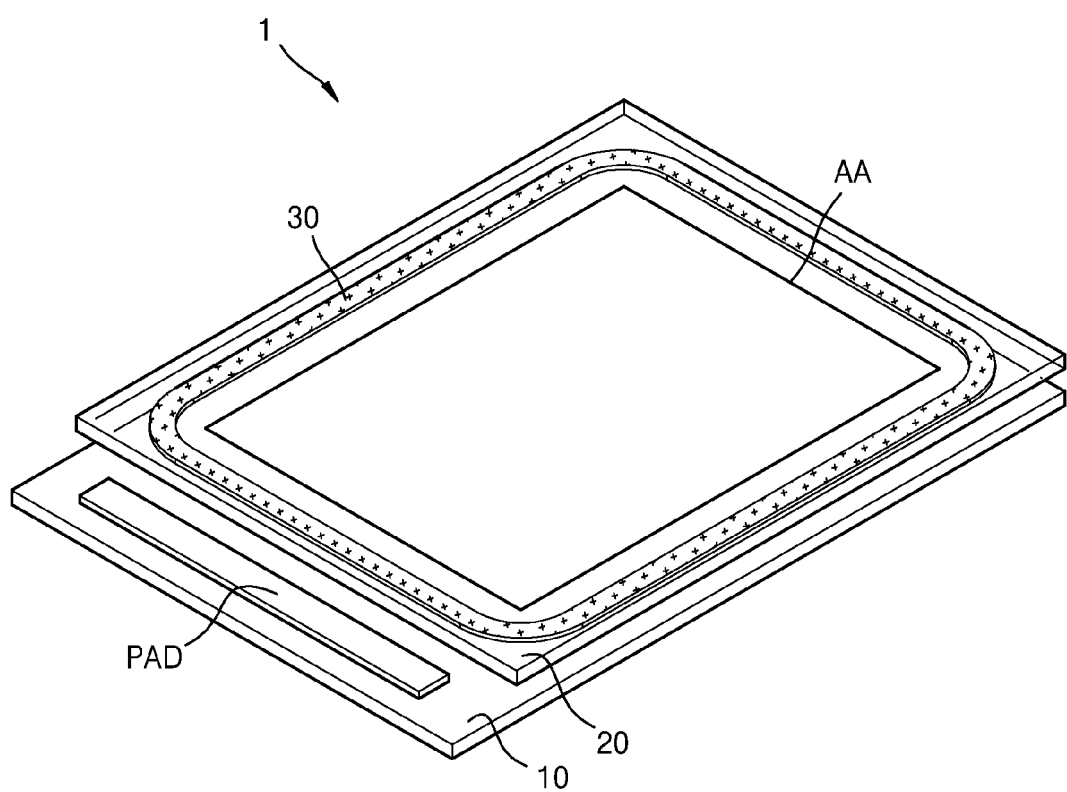
FIG. 1 is a schematic perspective view of a display apparatus according to an embodiment.

As the inventive concepts allow for various changes and numerous embodiments, particular embodiments will be illustrated in the drawings and described in detail in the written description. However, this is not intended to limit the inventive concepts to particular modes of practice, and it is to be appreciated that all changes, equivalents, and substitutes that do not depart from the spirit and technical scope are encompassed in the inventive concepts. In the description, certain detailed explanations of the related art are omitted when it is deemed that they may unnecessarily obscure the essence of the inventive concepts.

While such terms as "first," "second," and the like, may be used to describe various components, such components must not be limited to the above terms. The above terms are used only to distinguish one component from another.

The terms used in the present specification are merely used to describe particular embodiments, and are not intended to limit the inventive concepts. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items. Expressions such as "at least one of," when preceding a list of elements, modify the entire list of elements and do not modify the individual elements of the list.

Figure 2:
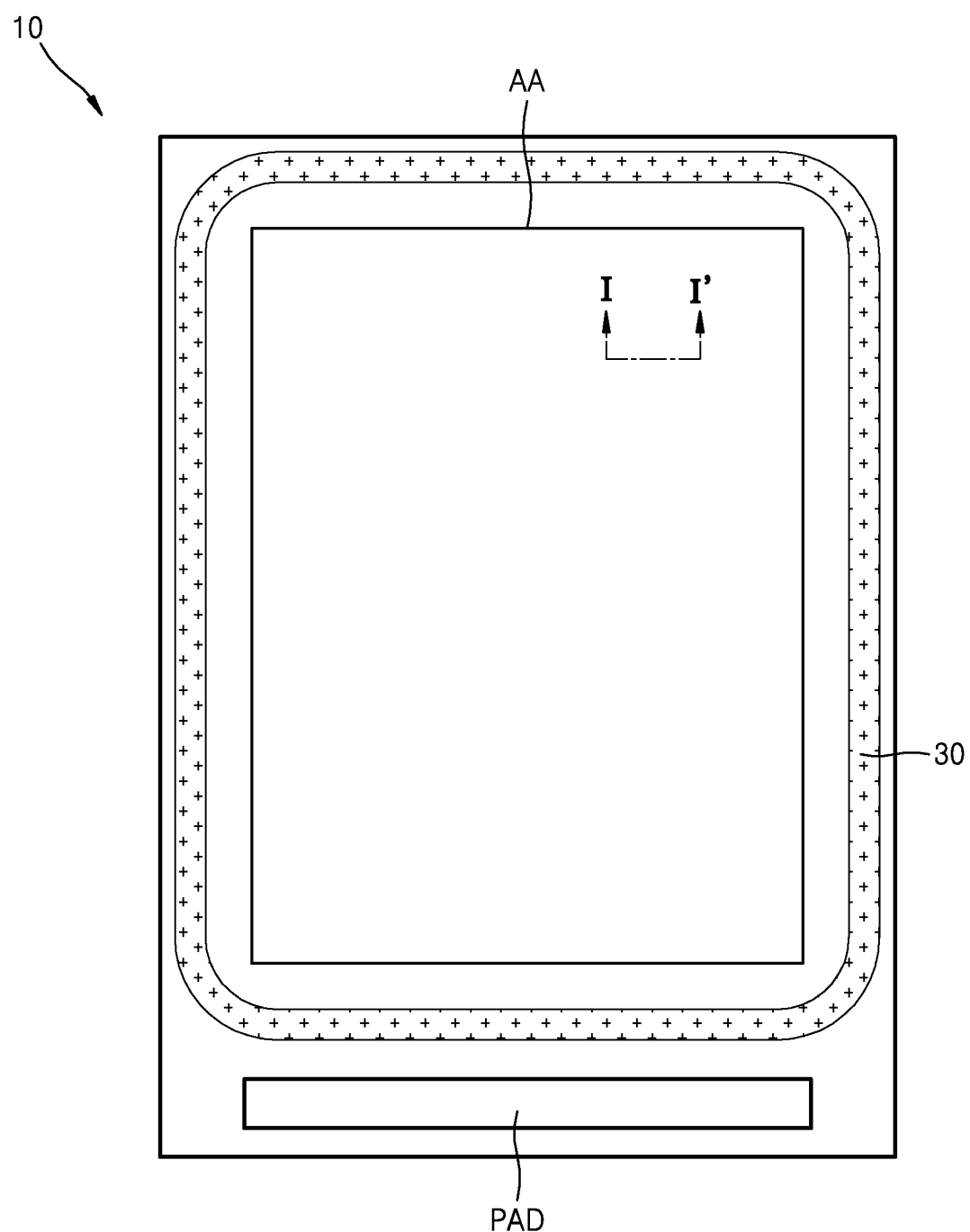
FIG. 2 is a schematic plan view of a first substrate in the display apparatus of FIG. 1.
Figure 3:
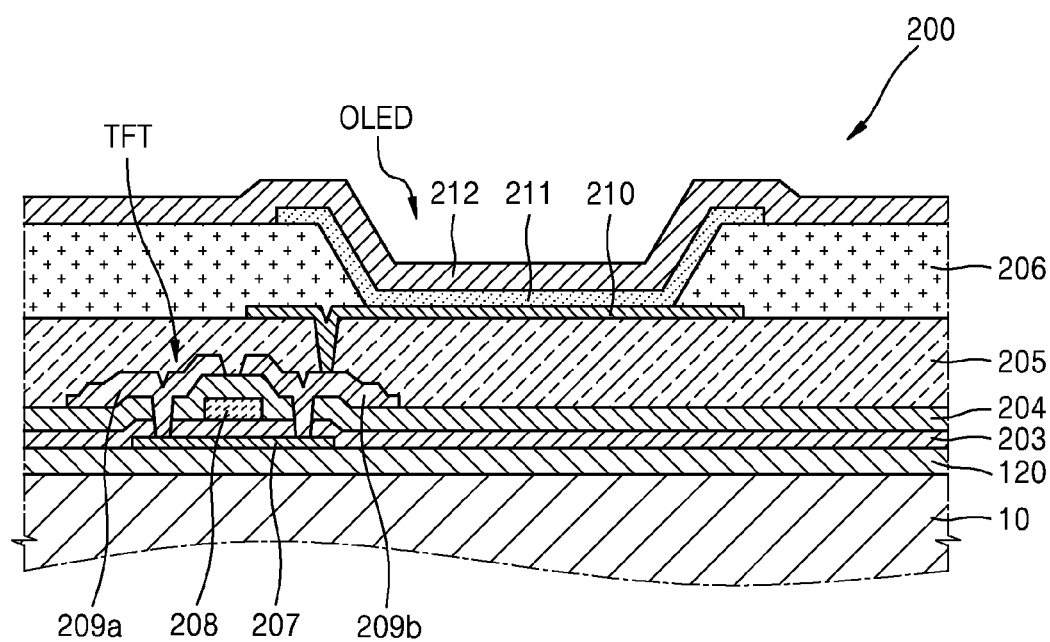
FIG. 3 is a schematic cross-sectional view of the first substrate taken along a line I-I' of FIG. 2.
Figure 4:
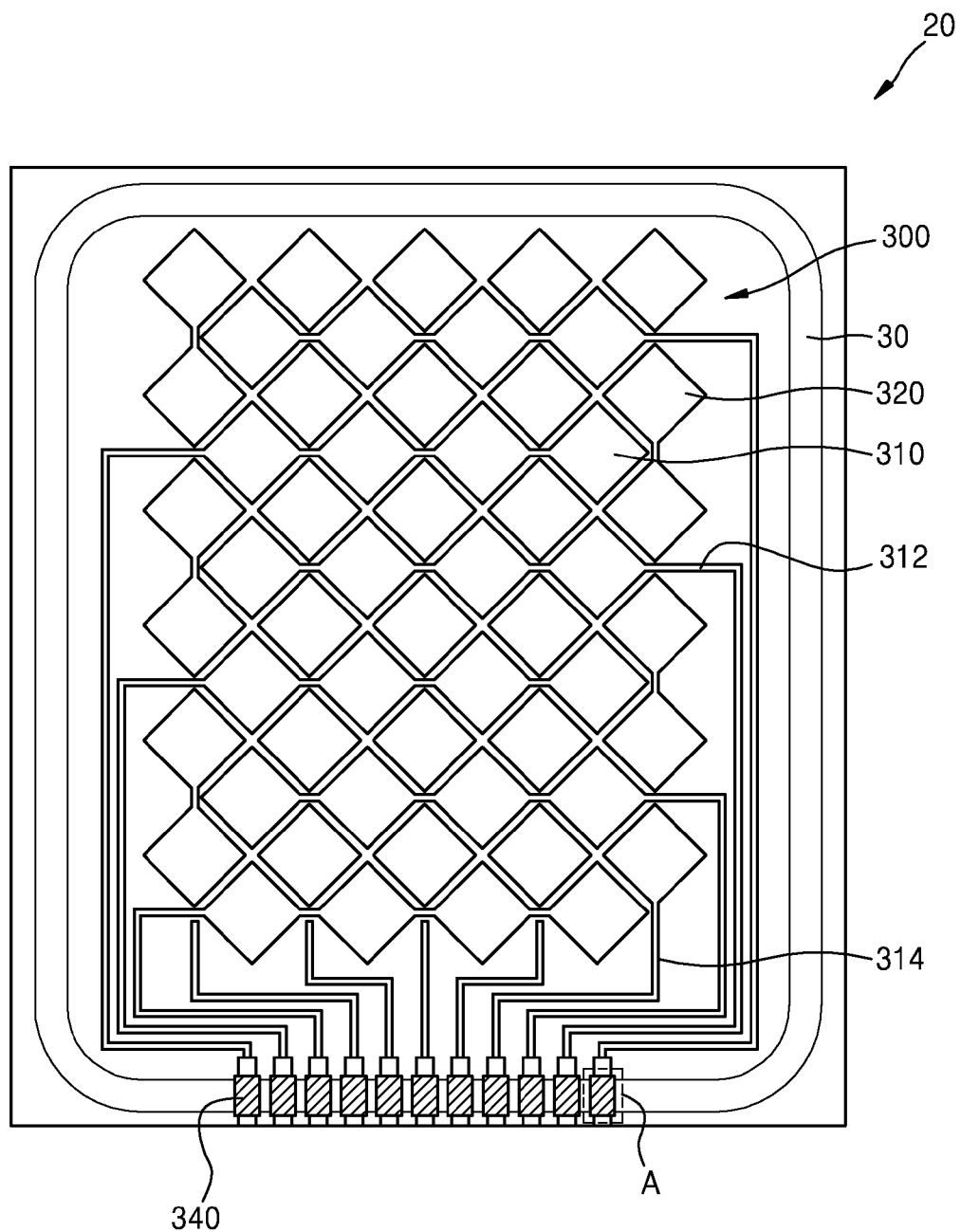
FIG. 4 is a schematic plan view of a second substrate in the display apparatus of FIG. 1.
Figure 5:
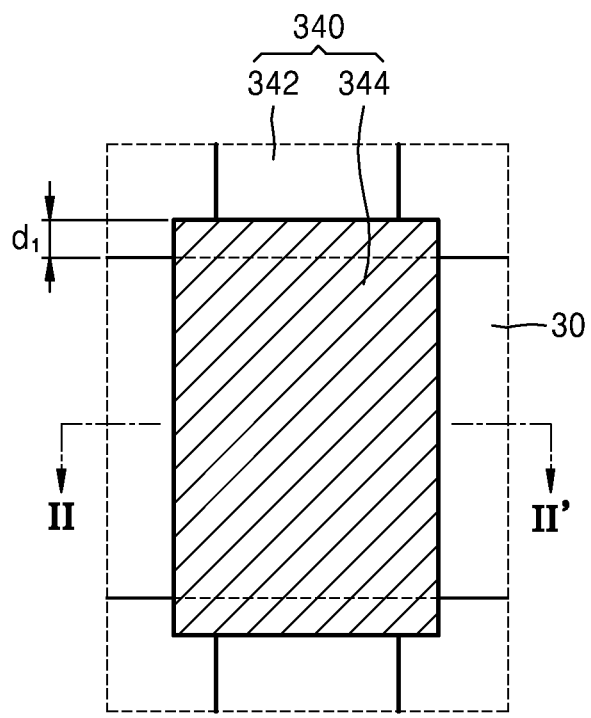
FIG. 5 is an enlarged view of a part A of FIG. 4.
Figure 6:
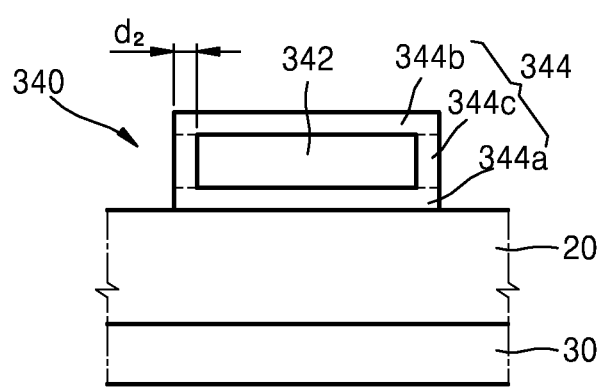
FIG. 6 is a schematic cross-sectional view of the second substrate taken along a line II-II' of FIG. 5.

FIG. 1 is a schematic perspective view of a display apparatus 1 according to an embodiment, FIG. 2 is a schematic plan view of a first substrate 10 in the display apparatus 1 of FIG. 1, and FIG. 3 is a schematic cross-sectional view of the first substrate 10 taken along a line I-I' of FIG. 2. FIG. 4 is a schematic plan view of a second substrate 20 in the display apparatus of FIG. 1, FIG. 5 is an enlarged view of a part A of FIG. 4, and FIG. 6 is a schematic cross-sectional view of the second substrate 20 taken along a line II-II' of FIG. 5.

Referring to FIGS. 1 to 6, the display apparatus 1 may include the first substrate 10 on which a display area AA is defined, the second substrate 20 facing the first substrate 10, and a sealing portion 30 bonding the first and second substrates 10 and 20 to each other.

The first substrate 10 may include a transparent glass material mainly containing $SiO_2$, but is not limited thereto, and the first substrate 10 may include a transparent plastic material. The plastic material may be an organic material selected from polyethersulphone (PES), polyacrylate (PAR), polyetherimide (PEI), polyethyelenen napthalate (PEN), polyethyelenetereptalate (PET), polyphenylene sulfide (PPS), polyallylate, polyimide, polycarnonate (PC), cellulose triacetate (TAC), or cellulose acetate propionate (CAP).

In a case of a bottom emission type, in which an image is displayed toward the first substrate 10, the first substrate 10 includes a transparent material. However, in a case of a top emission type, in which an image is displayed opposite to the first substrate 10, the first substrate 10 is not necessarily formed of a transparent material. In this case, the first substrate 10 may include metal. If the first substrate 10 includes metal, the first substrate 10 may include one or more of carbon, iron, chrome, manganese, nickel, titanium, molybdenium, stainless steel (SUS), an Inval alloy, an inconel alloy, or a kovar alloy, but is not limited thereto.

A display unit 200 may be formed on the first substrate 10. The display unit 200 provides images that the user may recognize. FIG. 3 shows an example, in which the display unit 200 includes an organic light emitting diode (OLED). However, embodiments are not limited thereto, and the display unit 200 may include a liquid crystal display (LCD) device or other display devices.

The display unit 200 includes a display area AA for displaying images, and a pad unit PAD may be disposed around the display area AA. The pad unit PAD may transmit an electric signal from a power supply device (not shown) or a signal generator (not shown) to the display area AA. Hereinafter, the display unit 200 will be described in more detail with reference to FIG. 3.

A buffer layer 120 may be formed on the first substrate 10. The buffer layer 120 may provide a planarization surface on an upper portion of the first substrate 10, and may prevent impurities or moisture from infiltrating through the first substrate 10. For example, the buffer layer 120 may include an inorganic material such as silicon oxide, silicon nitride, silicon oxynitride, aluminum oxide, aluminum nitride, titanium oxide, or titanium nitride, or an organic material such as polyimide, polyester, or acryl, and may be formed as a stacked body including a plurality of layers formed of the above example materials.

A thin film transistor TFT may be formed on the first substrate 10. The thin film transistor TFT may include an active layer 207, a gate electrode 208, a source electrode 209a, and a drain electrode 209b.

The active layer 207 may include an inorganic semiconductor such as, for example, silicon, or an organic semiconductor. The active layer 207 includes a source region, a drain region, and a channel region between the source and drain regions. For example, if the active layer 207 includes amorphous silicon, an amorphous silicon layer is formed on an entire surface of the first substrate 10 and crystallized to form a polycrystalline silicon layer. In addition, the polycrystalline silicon layer is patterned, and the source and drain regions are doped with impurities to form the active layer 207 including the source region, the drain region, and the channel region between the source and drain regions.

A gate insulating layer 203 is formed on the active layer 207. The gate insulating layer 203 insulates the active layer 207 and the gate electrode 208 from each other, and may include an inorganic material such as, for example, SiNx and $SiO_2$.

The gate electrode 208 is formed on a predetermined region on the gate insulating layer 203. The gate electrode 208 is connected to a gate line (not shown) for applying turning on/turning off signals of the thin film transistor TFT. The gate electrode 208 may include Au, Ag, Cu, Ni, Pt, Pd, Al, or Mo, or an alloy such as Al:Nd alloy or Mo:W alloy; however, embodiments are not limited thereto, and the gate electrode 208 may be formed of various other materials.

An interlayer insulating layer 204 is formed on the gate electrode 208 for insulating the gate electrode 208 from the source electrode 209a and the drain electrode 209b, and may include an inorganic material such as, for example, SiNx and $SiO_2$.

The source electrode 209a and the drain electrode 209b are formed on the interlayer insulating layer 204. The interlayer insulating layer 204 and the gate insulating layer 203 are formed to expose the source region and the drain region of the active layer 207, and the source electrode 209a and the drain electrode 209b are formed to contact the exposed source and drain regions of the active layer 207.

The source electrode 209a and the drain electrode 209b may be formed as a single-layered structure or a multi-layered structure by using one or more of Al, Pt, Pd, Ag, Mg, Au, Ni, Nd, Ir, Cr, Li, Ca, Mo, Ti, W, or Cu.

FIG. 3 shows a top gate type thin film transistor including the active layer 207, the gate electrode 208, the source electrode 209a, and the drain electrode 209b sequentially as an example, but is not limited thereto. That is, the gate electrode 208 may be disposed under the active layer 207.

The thin film transistor TFT is electrically connected to the OLED to apply signals for driving the OLED to the OLED. The thin film transistor TFT may be covered by a planarization layer 205.

The planarization layer 205 may be an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, or PZT. The organic insulating layer may include a general universal polymer (PMMA or PS), polymer derivatives having phenol groups, acryl-based polymer, imide-based polymer, aryl ether-based polymer, amide-based polymer, fluoride-based polymer, p-xylene-based polymer, vinyl alcohol-based polymer, or blends thereof. In some embodiments, the planarization layer 205 may be formed as a composite stacked layer including the inorganic insulating layer and the organic insulating layer.

The OLED may be formed on the planarization layer 205. The OLED may include a pixel electrode 210, an intermediate layer 211, and an opposite electrode 212.

The pixel electrode 210 is formed on the planarization layer 205 and may be electrically connected to the thin film transistor TFT via a contact hole formed in the planarization layer 205. The pixel electrode 210 may be, for example, a reflective electrode. For example, the pixel electrode 210 may include a reflective layer including Ag, Mg, Al, Pt, Pd, Au, Ni, Nd, Ir, Cr, or a compound thereof, and a transparent or a semi-transparent electrode layer formed on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

The opposite electrode 212 facing the pixel electrode 210 may be a transparent or a semi-transparent electrode, and may include a metal thin film having a small work function and including Li, Ca, LiF/Ca, LiF/Al, Al, Ag, Mg, or a compound thereof. Also, an auxiliary electrode layer or a bus electrode may be further formed of a transparent electrode forming material such as, for example, ITO, IZO, ZnO, or $In_2O_3$ on the metal thin film. Therefore, the opposite electrode 212 may transmit light emitted from an organic emission layer included in the intermediate layer 211. That is, the light emitted from the organic emission layer may be discharged directly toward the opposite electrode 212 or after being reflected by the pixel electrode 210 formed as a reflective electrode.

However, the display unit 200 is not limited to the top emission type, but may be a bottom emission type, in which light emitted from the organic emission layer is discharged toward the first substrate 10. In this case, the pixel electrode 210 is formed as a transparent or a semi-transparent electrode, and the opposite electrode 212 may be formed as a reflective electrode. Also, the display unit 200 may be a dual-emission type, in which the light is emitted toward both the top and bottom surfaces.

In addition, a pixel defining layer 206 including an insulating material is formed on the pixel electrode 210. The pixel defining layer 206 may include at least one organic insulating material selected from polyimide, polyamide, an acryl resin, benzocyclobutene, or a phenol resin and be formed by a spin coating method. The pixel defining layer 206 exposes a predetermined region of the pixel electrode 210, and the intermediate layer 211, including the organic emission layer, is located on the exposed region.

The organic emission layer included in the intermediate layer 211 may include a low molecular organic material or a high molecular organic material, and the intermediate layer 211 may selectively further include functional layers such as a hole transport layer (HTL), a hole injection layer (HIL), an electron transport layer (ETL), and an electron injection layer (EIL) in addition to the organic emission layer.

The second substrate 20 is disposed to face a surface of the first substrate 10. The second substrate 20 may protect the display unit 200 against external moisture or oxygen, and may include a transparent material. The second substrate 20 may include glass, plastic, or a stacked structure including a plurality of organic and inorganic materials.

The sealing portion 30 surrounds the display area AA between the first substrate 10 and the second substrate 20, and then, the first substrate 10 and the second substrate 20 are bonded to each other to seal a space between the first and second substrates 10 and 20. Therefore, the display unit 200 disposed between the first substrate 10 and the second substrate 20 may be sealed against the external moisture, air, and the other impurities.

The sealing portion 30 may include a glass frit and/or a filler. The glass frit forms the sealing portion 30 and is melted by heat and cured to bond the first substrate 10 and the second substrate 20 to each other. The glass frit may include various materials. For example, the glass frit may include vanadium oxide or bismuth oxide. Also, the glass frit may include various materials, for example, at least one of $TeO_2$, ZnO, BaO, $Nb_2O_5$, $SiO_2$, $Al_2O_3$, $ZrO_2$, or $P_2O_5$.

When irradiating a laser beam for forming the sealing portion 30, the filler makes a thermal expansion coefficient of the sealing portion 30 not increase, and in particular, reduces a difference between the thermal expansion rates of the sealing portion 30 and the first and second substrates 10 and 20 so that the sealing portion 30, the first substrate 10, and the second substrate 20 may be effectively bonded to each other. The filler may include one or more of Cr, Cu, and Mn. Also, the filler may contain oxides of spinel structure. For example, the filler may include $(CrMn)_2O_4$.

In addition, the second substrate 20 may include a touch screen layer 300 on a surface thereof so as to perform as a touch panel. The touch screen layer 300 may be formed on an outer surface of the second substrate 20. Here, the outer surface of the second substrate 20 may denote a surface opposite to the display unit 200.

The touch screen layer 300 may include a plurality of first and second sensing patterns 310 and 320, and bonding pad portions 340 that are electrically connected to the plurality of first and second sensing patterns 310 and 320. The plurality of first and second sensing patterns 310 and 320 and the bonding pad portions 340 may be electrically connected to each other via a plurality of first and second connectors 312 and 314.

The plurality of first and second sensing patterns 310 and 320 may include a plurality of first sensing patterns 310 and a plurality of second sensing patterns 320. For example, the plurality of first sensing patterns 310 and the plurality of second sensing patterns 320 may each have a trapezoidal shape. However, embodiments are not limited thereto, and the plurality of first and second sensing patterns 310 and 320 may have various other shapes.

The plurality of first sensing patterns 310 may be arranged along a direction, and the first connectors 312 may connect the first sensing patterns 310 that are adjacent to each other.

The plurality of second sensing patterns 320 are electrically insulated from the plurality of first sensing patterns 310, and may be arranged in a direction crossing the direction in which the plurality of first sensing patterns 310 are arranged. For example, the plurality of second sensing patterns 320 may be arranged in a direction perpendicular to the direction in which the plurality of sensing patterns 310 are arranged. The second connectors 314 may connect the second sensing patterns 320 that are adjacent to each other.

The touch screen 300 may be a capacitive type, and the plurality of first and second sensing patterns 310 and 320 and the opposite electrode 212 may form one capacitor. If the user touches the second substrate 20 by using a touch input unit, the touch input unit on the outside and the plurality of sensing patterns 310 and 320 form another capacitor. That is, two capacitors are connected in series by the touch input, and thus, a capacitance changes, and a location where the capacitance changes and a degree of the variation are sensed to realize a touch panel performance.

The bonding pad portions 340 are connected to a driving circuit of the display unit 200 to transmit the variation in the capacitance according to the touched location to the driving circuit. Each of the bonding pad portions 340 may include a pad electrode 342 electrically connected to the plurality of first and second sensing patterns 310 and 320, and a cover portion 344 covering a part of the pad electrode 342.

The pad electrode 342 may include a low resistive metal material. For example, the pad electrode 342 may include at least one of Mo, Al, Cu or Ti. Thus, the variation in the capacitance according to the touched location may be rapidly transmitted to the driving circuit, and thus, a response speed of the touch screen layer 300 may be improved.

In addition, the bonding pad portions 340 are formed on one side edge of the second substrate 20, and thus, partially overlap with the sealing portion 30. The bonding pad portions 340 may have the cover portions 344 covering the pad electrode 342 partially on locations that partially overlap with the sealing portion 30.

The cover portion 344 may be include a material that is opaque and has a higher resistance than that of the pad electrode 342. The cover portion 344 may include a material that absorbs light to convert the light to heat. For example, the cover portion 344 may include at least one of Mn, Cr, Ni, or Co.

Therefore, when irradiating a laser beam from the second substrate 20 side to the sealing portion 30 in order to form the sealing portion 30, the cover portion 344 may absorb the laser and transmit the heat to the sealing portion 30 via the second substrate 20 to make the sealing portion 30 melt. That is, even if the pad electrode 342 includes a low resistive metal material that is opaque, the sealing portion 30 overlapping with the bonding pad portions 340 may be melted due to black body radiation of the cover portion 344.

The cover portion 344 may include a first part 344a formed on a lower surface of the pad electrode 342, a second part 344b disposed on an upper surface of the pad electrode 342, and a pair of side portions 344c connecting the first part 344a and the second part 344b to each other. The bonding pad portion 340 may be formed by forming the first part 344a on the second substrate 20, forming the pad electrode 342 on the first part 344a, and forming the second part 344b and the pair of side portions 344c.

The laser beam irradiated to form the sealing portion 30 is absorbed by the second part 344b, and the heat may be transferred via the side portions 344c and the first part 344a. Also, the laser absorbed by the second part 344b is converted into heat and transferred to the first part 344a via the pad electrode 342.

If a thickness of the second part 344b is less than about 500 Å, transparency of the second part 344b increases, and thus, an efficiency of absorbing the laser beam in the second part 344b may be reduced. Accordingly, the pad electrode 342 may absorb the laser, and electronic devices connected to the pad electrode 342 may be damaged. On the other hand, if the thickness of the second part 344b is greater than about 1000 Å, the pad electrode 342 and the second part 344b may be isolated from each other. Therefore, the second part 344b may have a thickness between about 500 Å and about 1000 Å.

In addition, in order to effectively melt the sealing portion 30 overlapping with the pad electrode 342, the cover portion 344 may be greater than an overlapping area between the pad electrode 342 and the sealing portion 30.

In particular, an end portion of the cover portion 344 along the length direction of the pad electrode 342 may be separate from the sealing portion 30 by a first distance $d_1$. The first distance $d_1$ may be about 5% to about 10% of a width of the sealing portion 30.

If the first distance $d_1$ is less than about 5% of the width of the sealing portion 30, it may be difficult to melt the edge of the sealing portion 30 along with the length direction of the pad electrode 342 on the region where the sealing portion 30 and the pad electrode 342 overlap with each other. If the first distance $d_1$ is greater than about 10% of the width of the sealing portion 30, the thermal transfer to the sealing portion 30 overlapping with the pad electrode 342 may not be concentrated. In addition, the cover portion 344 may be separate from opposite sides of the sealing portion 30 by the first distance $d_1$ along with the length direction of the pad electrode 342. Therefore, a length of the cover portion 344 along with the length direction of the pad electrode 342 may be about 110% to about 120% of the width of the sealing portion 30.

Likewise, an end portion of the cover portion 344 along with a direction perpendicular to the lengthwise direction of the pad electrode 342 may be separate from the pad electrode 342 by a second distance $d_2$. The second distance $d_2$ may be about 5% to about 10% of a width of the pad electrode 342, and denotes a thickness of one of the pair of side portions 344c.

If the thickness of the side portion 344c is less than about 5% of the width of the pad electrode 342, it may be hard to melt the edge of the sealing portion 30 along the direction perpendicular to the length direction of the pad electrode 342 on the region where the sealing portion 30 and the pad electrode 342 overlap with each other. In addition, if the thickness of the side portion 344c is greater than about 10% of the width of the pad electrode 342, the thermal transfer to the sealing portion 30 overlapping with the pad electrode 342 may not be concentrated. In addition, since the side portions 344c are formed on opposite sides of the pad electrode 342, the width of the cover portion 344 in the direction perpendicular to the length direction of the pad electrode 342 may be about 110% to about 120% of the width of the pad electrode 342.

As described above, since the bonding pad portion 340 includes the cover portion 344 that covers the pad electrode 342 on the region where the bonding pad portion 340 and the sealing portion 30 overlap with each other, the pad electrode 342 may include an opaque metal material, and accordingly, the response speed of the touch screen layer 300 may be improved.

Figure 7:
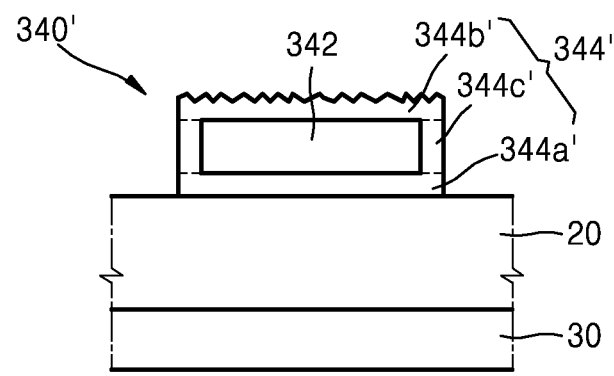
FIG. 7 is a schematic cross-sectional view of another example of the second substrate taken along line II-II' of FIG. 5.

FIG. 7 is a cross-sectional view showing another example of the sealing portion 30 taken along a line II-II' of FIG. 5.

Referring to FIG. 7, a bonding pad portion 340' may include the pad electrode 342, and a cover portion 344' covering the pad electrode 342 at a region where the pad electrode 342 and the sealing portion 30 overlap with each other. The pad electrode 342 and the sealing portion 30 are the same as those of FIGS. 1 to 6, and thus, detailed descriptions thereof are not provided here.

The cover portion 344' includes a first part 344a' disposed on the lower surface of the pad electrode 342, a second part 344b' disposed on the upper surface of the pad electrode 342, and a pair of side portions 344c' connecting the first part 344a' and the second part 344b' to each other. When irradiating laser from the second substrate 20 side toward the sealing portion 30 in order to form the sealing portion 30, the cover portion 344' absorbs the laser and transfers heat to the sealing portion 30 via the second substrate 20 to make the sealing portion 30 melt. The second part 344b' may have an irregular surface structure in order to improve an absorbency of the laser, and accordingly, the melting of the sealing portion 30 may be performed more effectively.

Figure 8:
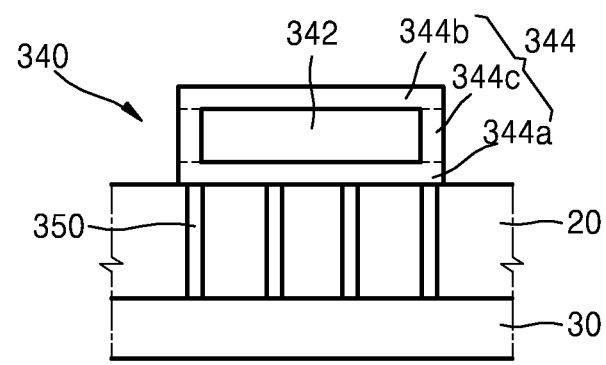
FIG. 8 is a schematic cross-sectional view of another example of the second substrate taken along line II-II' of FIG. 5.

FIG. 8 is a cross-sectional view showing another example of the sealing portion 30 taken along the line II-II' of FIG. 5.

Referring to FIG. 8, the bonding pad portion 340 may include the pad electrode 342, and the cover portion 344 surrounding the pad electrode 342 on the region where the pad electrode 342 and the sealing portion 30 overlap with each other.

The pad electrode 342 may include a low resistive metal material that is opaque, and the cover portion 344 may include a material that absorbs the laser and converts the laser into the heat.

The cover portion 344 includes the first part 344a disposed on the lower surface of the pad electrode 342, the second part 344b disposed on the upper surface of the pad electrode 342, and the pair of side portions 344c connecting the first part 344a and the second part 344b to each other. When irradiating the laser from the second substrate 20 toward the sealing portion 30 in order to form the sealing portion 30, the cover portion 344 absorbs the laser and transfers the heat to the sealing portion 30 via the second substrate 20 to make the sealing portion 30 melt.

A plurality of via holes are formed in the second substrate 20, and thermal conductive members 350 contacting the first part 344a and the sealing portion 30 may be filled in the plurality of via holes. Therefore, the thermal transfer to the sealing portion 30 may be performed more effectively.

As described above, according to the one or more embodiments, a response speed of the touch screen layer may be improved.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
a first substrate on which a display area is defined;
a second substrate facing the first substrate and comprising a touch screen layer on a surface thereof; and
a sealing portion between the first substrate and the second substrate and bonding the first substrate and the second substrate to each other, the sealing portion formed around the display area,
wherein the touch screen layer comprises a plurality of sensing patterns and a plurality of bonding pad portions electrically connected to the plurality of sensing patterns,
wherein each of the bonding pad portions comprises a pad electrode electrically connected to the plurality of sensing patterns and a cover portion surrounding a part of the pad electrode,
wherein the cover portion is opaque and overlaps the sealing portion,
wherein a length of the cover portion along with a length direction of the pad electrode is about 110% to about 120% of a width of the sealing portion, and
wherein the pad electrode has a resistance that is less than a resistance of the cover portion.

2. The display apparatus of claim 1, wherein the cover portion converts absorbed light into heat.

3. The display apparatus of claim 1, wherein the cover portion performs a black-body radiation.

4. The display apparatus of claim 1, wherein the cover portion comprises at least one of manganese, chrome, nickel, or cobalt.

5. The display apparatus of claim 1, wherein the cover portion comprises a first part disposed on a lower surface of the pad electrode, a second part disposed on an upper surface of the pad electrode, and a pair of side portions that connect the first part and the second part to each other, wherein the second part has a thickness between about 500 Å and about 1000 Å.

6. The display apparatus of claim 5, wherein the second part has an irregular surface structure.

7. The display apparatus of claim 5, wherein the second substrate has a plurality of via holes, and a conductive member that contacts the first part and the sealing portion is filled in each of the plurality of via holes.

8. The display apparatus of claim 1, wherein a width of the cover portion in a direction perpendicular to a length direction of the pad electrode is about 110% to about 120% of a width of the pad electrode.

9. The display apparatus of claim 1, wherein the touch screen layer further comprises connectors for connecting the plurality of sensing patterns and the bonding pad portions to each other.

10. The display apparatus of claim 9, wherein the plurality of sensing patterns comprise a plurality of first sensing patterns and a plurality of second patterns that are electrically insulated from the plurality of first sensing patterns.

11. The display apparatus of claim 10, wherein the plurality of first sensing patterns are arranged in a first direction and the plurality of second sensing patterns are arranged in a second direction crossing the first direction, and the connectors comprise a first connector connecting the first sensing patterns that are adjacent to each other, and a second connector connecting the second sensing patterns that are adjacent to each other.

12. The display apparatus of claim 1, further comprising a display unit having the display area on the first substrate, wherein the display unit comprises an organic light emitting diode, and the organic light emitting diode comprises a first electrode, a second electrode, and an intermediate layer disposed between the first electrode and the second electrode and comprising an organic emission layer.

13. The display apparatus of claim 12, further comprising a thin film transistor electrically connected to the first electrode and comprising an active layer, a gate electrode, a source electrode, and a drain electrode.

14. A display apparatus, comprising:
a first substrate on which a display area is defined;
a second substrate facing the first substrate and comprising a touch screen layer on a surface thereof; and
a sealing portion between the first substrate and the second substrate and bonding the first substrate and the second substrate to each other, the sealing portion formed around the display area,
wherein the touch screen layer comprises a plurality of sensing patterns and a plurality of bonding pad portions electrically connected to the plurality of sensing patterns,
wherein each of the bonding pad portions comprises a pad electrode electrically connected to the plurality of sensing patterns and a cover portion surrounding a part of the pad electrode, wherein the pad electrode comprises at least one of Mo, Al, Cu or Ti,
wherein a length of the cover portion along with a length direction of the pad electrode is about 110% to about 120% of a width of the sealing portion, and
wherein the cover portion is opaque and overlaps the sealing portion.

15. The display apparatus of claim 14, wherein the cover portion comprises at least one of manganese, chrome, nickel, or cobalt.

16. The display apparatus of claim 14, wherein the cover portion comprises a first part disposed on a lower surface of the pad electrode, a second part disposed on an upper surface of the pad electrode, and a pair of side portions that connect the first part and the second part to each other, wherein the second part has a thickness between about 500 Å and about 1000 Å.

17. The display apparatus of claim 14, wherein a width of the cover portion in a direction perpendicular to a length direction of the pad electrode is about 110% to about 120% of a width of the pad electrode.

18. The display apparatus of claim 14, wherein the touch screen layer further comprises connectors for connecting the plurality of sensing patterns and the bonding pad portions to each other.

* * * * *